(12) United States Patent
Kikuchi et al.

(10) Patent No.: US 12,446,162 B2
(45) Date of Patent: Oct. 14, 2025

(54) SCREEN MASK INSPECTION DEVICE, SOLDER PRINTING INSPECTION DEVICE, AND METHOD FOR INSPECTING SCREEN MASK

(71) Applicant: CKD CORPORATION, Aichi (JP)

(72) Inventors: Kazuyoshi Kikuchi, Aichi (JP); Takayuki Shinyama, Aichi (JP); Tsuyoshi Ohyama, Aichi (JP); Norihiko Sakaida, Aichi (JP)

(73) Assignee: CKD Corporation, Aichi (JP)

( * ) Notice: Subject to any disclaimer, the term of this patent is extended or adjusted under 35 U.S.C. 154(b) by 516 days.

(21) Appl. No.: 17/953,888

(22) Filed: Sep. 27, 2022

(65) Prior Publication Data

US 2023/0014796 A1 Jan. 19, 2023

Related U.S. Application Data

(63) Continuation of application No. PCT/JP2021/014141, filed on Apr. 1, 2021.

(30) Foreign Application Priority Data

Jun. 5, 2020 (JP) ................................ 2020-098245

(51) Int. Cl.
*H05K 3/34* (2006.01)
*B23K 1/00* (2006.01)
(Continued)

(52) U.S. Cl.
CPC ............ *H05K 3/3452* (2013.01); *B23K 1/00* (2013.01); *B41F 15/08* (2013.01); *B41F 15/36* (2013.01);
(Continued)

(58) Field of Classification Search
CPC ...... H05K 3/34; H05K 3/3452; H05K 3/1216; H05K 3/3485; H05K 1/0269;
(Continued)

(56) References Cited

U.S. PATENT DOCUMENTS 5,555,316 A * 9/1996 Tsujikawa ............ H05K 3/1233
348/90
6,609,458 B2 * 8/2003 Yamasaki ............... B41F 15/26
101/485

(Continued)

FOREIGN PATENT DOCUMENTS

JP H11-986 A 1/1999
JP 2009-92557 A 4/2009
(Continued)

OTHER PUBLICATIONS

International Preliminary Report on Patentability issued in corresponding International Application No. PCT/JP2021/014141 mailed Dec. 15, 2022 (12 pages).
(Continued)

*Primary Examiner* — Sumati Lefkowitz
*Assistant Examiner* — Ryan P Potts
(74) *Attorney, Agent, or Firm* — Osha Bergman Watanabe & Burton LLP

(57) ABSTRACT

A screen mask inspection device inspects a screen mask including a screen opening that forms a printing pattern, and includes: an inspection control device that detects solder position information of a solder paste printed on a substrate via the screen opening, and based on the solder position information, determines whether a quality of printing using the screen mask is good or bad, the solder position information being based on an amount of positional misalignment of the solder paste actually printed on the substrate relative to a predetermined reference position.

5 Claims, 10 Drawing Sheets

(51) Int. Cl.
  *B41F 15/08* (2006.01)
  *B41F 15/36* (2006.01)
  *B41F 33/00* (2006.01)
  *B41F 33/16* (2006.01)
  *G01N 21/89* (2006.01)
  *G01N 21/956* (2006.01)
  *H05K 1/02* (2006.01)

(52) U.S. Cl.
  CPC ...... *B41F 33/0027* (2013.01); *B41F 33/0036* (2013.01); *B41F 33/0081* (2013.01); *B41F 33/16* (2013.01); *G01N 21/8914* (2013.01); *G01N 21/95607* (2013.01); *H05K 1/0269* (2013.01); *H05K 3/3485* (2020.08); *B41P 2215/114* (2013.01); *G01N 2021/8918* (2013.01); *G01N 2021/95646* (2013.01); *H05K 2203/163* (2013.01); *H05K 2203/166* (2013.01)

(58) Field of Classification Search
  CPC ........ H05K 2203/163; H05K 2203/166; B41F 15/08; B41F 15/0881; B41F 15/36; B41F 33/0009; B41F 33/0027; B41F 33/0036; B41F 33/0081; B41F 33/02; B41F 33/16; G01N 21/89; G01N 21/892; G01N 21/8914; G01N 21/8921; G01N 21/95607; G01N 2021/8918; G01N 2021/9546; B41P 2215/114; B41P 2233/10; B41P 2233/11; B41P 2233/13; B23K 1/00

See application file for complete search history.

(56) References Cited

U.S. PATENT DOCUMENTS

| | | | | |
|---|---|---|---|---|
| 7,310,438 | B2* | 12/2007 | Prince | B23K 3/08 382/145 |
| 2003/0027363 | A1* | 2/2003 | Kodama | G05B 19/4065 438/14 |
| 2008/0289518 | A1* | 11/2008 | Inoue | B41F 15/26 101/129 |
| 2013/0204563 | A1* | 8/2013 | Hirai | G06F 17/18 702/81 |
| 2019/0200494 | A1* | 6/2019 | Kim | B41F 33/0036 |

FOREIGN PATENT DOCUMENTS

| | | |
|---|---|---|
| JP | 2013-161894 A | 8/2013 |
| WO | WO-2019058926 A1 * | 3/2019 ............. B41M 1/12 |

OTHER PUBLICATIONS

International Search Report issued in corresponding International Application No. PCT/JP2021/014141 mailed Jun. 29, 2021 (5 pages).

Written Opinion issued in corresponding International Application No. PCT/JP2021/014141 mailed Jun. 29, 2021 (4 pages).

* cited by examiner

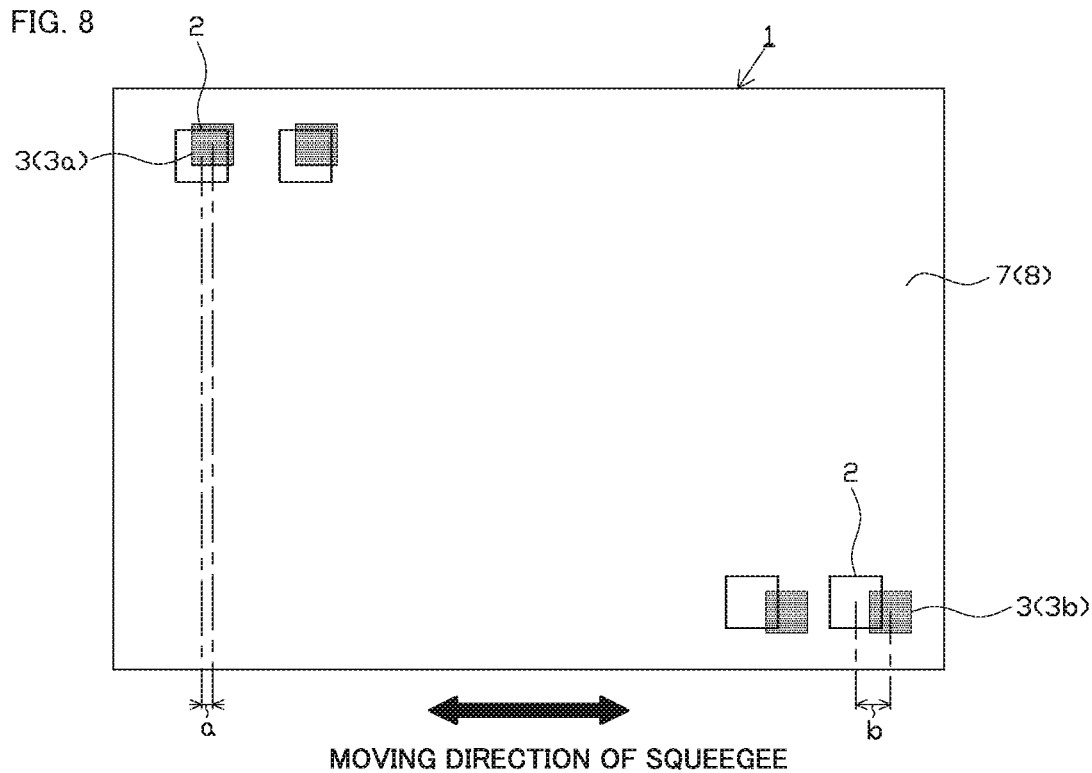

SCREEN MASK INSPECTION DEVICE, SOLDER PRINTING INSPECTION DEVICE, AND METHOD FOR INSPECTING SCREEN MASK

BACKGROUND

Technical Field

The present disclosure relates to an inspection device of a screen mask and an inspection method of the screen mask used in the process of printing solder pastes on a substrate, as well as a solder printing inspection device provided with a function of inspecting the screen mask.

Description of Related Art

A production line of mounting electronic components on a substrate first prints solder paste on lands provided in the substrate by a solder printing machine. The production line then temporarily fixes electronic components on the substrate, based on the viscosity of the solder paste. The production line subsequently causes the substrate to be guided into a reflow furnace and go through a predetermined reflow process to implement soldering.

A screen mask is used in a process of printing the solder paste by the solder printing machine. The screen mask is made of, for example, a metal such as stainless steel and has screen openings (apertures) provided to form a printing pattern. A procedure of printing the solder paste presses the screen mask against the substrate, places the solder paste on a surface of the screen mask and moves a predetermined squeegee pressed against the surface of the screen mask, so as to cause the solder paste to enter the screen openings. With a view to preventing a slack, the screen mask is held in such a state that a tensile force is applied by a predetermined frame or the like.

In the process of printing solder paste by using the screen mask, one proposed technique regulates a relative position of the screen mask to the substrate, based on a correction value of a printing misalignment ratio of the printed solder paste, so as to correct a printing position of the solder paste (as described in, for example, Patent Literature 1).

Patent Literature

Patent Literature 1: JP 2009-92557A

During printing of the solder paste, the screen mask may have a deformation (stretch) or a positional misalignment by the effects of a tensile force applied, a pressing force against the substrate, and a force applied from the squeegee. This deformation includes not only a permanent deformation but a temporary deformation. In the case where an amount of deformation or an amount of positional misalignment of the screen mask in the printing process exceeds an allowable range, it is difficult or impossible to print the solder paste at an appropriate position even when the relative position of the screen mask to the substrate is regulated as described above. This may cause a decrease in yield or production of defectives.

For example, as shown in FIG. 13, in a screen mask SM having screen openings O1 and O2 corresponding to lands R1 and R2 (shown in FIG. 14) on a printed circuit board 1 (corresponding to the "substrate"), it is assumed that an amount of deformation (amount of stretch) s between the screen openings O1 and O2 is equivalent to a width W of the lands R1 and R2. In this case, even when a relative position of the screen mask SM to the printed circuit board 1 is appropriately regulated, amounts of positional misalignment t of solder pastes 3 relative to the lands R1 and R2 are "W/2" as shown in FIG. 14. It is accordingly difficult to print the solder pastes 3 at appropriate positions. In another example, as shown in FIG. 15 and FIG. 16, in the case where the amount of deformation s is approximately twice the width W, even when the relative position of the screen mask SM to the printed circuit board 1 is appropriately regulated, the amounts of positional misalignment t are "W". It is accordingly impossible to print the solder pastes 3 on the lands R1 and R2. The width W of the land may be as small as 0.1 mm or less. The issue described above may accordingly arise even in the case of a small deformation of the screen mask.

SUMMARY

One or more embodiments of the present disclosure provide a screen mask inspection device and the like that ensures an inspection with the higher accuracy to determine whether a screen mask is in such a state that solder pastes are appropriately printable.

The following describes each of various aspects provided adequately in view of above issues. Functions and advantageous effects that are characteristic of each of the aspects are also described as appropriate.

Aspect 1. There is provided a screen mask inspection device configured to perform inspection of a screen mask provided with a screen opening that forms a printing pattern and configured to print a solder paste on a substrate via the screen opening. The screen mask inspection device comprises a solder position information detection unit configured to detect position information of a solder paste printed on the substrate; and an in-use measure determination unit configured to perform good/bad quality judgment with regard to the screen mask in a printing process, based on the position information detected by the solder position information detection unit.

The configuration of Aspect 1 detects the position information of the printed solder paste and performs good/bad quality judgment with regard to the screen mask in the printing process, based on the detected position information. This configuration uses the position information of the printed solder paste to determine the good/bad quality of the screen mask in the printing process by taking into consideration an external factor affecting the screen mask in the printing process, for example, a pressing force against the substrate or a force applied from a squeegee, as well as the screen mask itself. Accordingly, this configuration ensures an inspection with the higher accuracy to determine whether the screen mask is in such a state that the solder paste is appropriately printable.

In one or more embodiments, information having a component along a moving direction of a squeegee (a component used to spread the solder paste) may be used as the position information of the solder paste. This provides position information that strongly reflects the effect of the moving squeegee and that more explicitly indicates a degree of deformation or positional misalignment in the screen mask. This configuration thus ensures an inspection with high accuracy to determine whether the screen mask is in such a state that the solder paste is appropriately printable.

Aspect 2. In the screen mask inspection device described in Aspect 1, the solder position information detection unit may detect information based on an amount of positional misalignment of an actually printed solder paste relative to a predetermined reference position, as the position information.

The "reference position" may be, for example, a position of a land provided on the substrate (as a printing object where a solder paste is printed) or an ideal (designed) printing position of a solder paste, any arbitrary position selected on the substrate or the like (the same applies to Aspect 9 described later).

The configuration of Aspect 2 detects the information based on the amount of positional misalignment of the solder paste, as the position information. This configuration enables position information required for good/bad quality judgment to be readily obtained and reduces the load relating to an inspection process.

In the case where the screen mask inspection device is provided in a solder printing inspection device that has a function of performing good/bad quality judgment of the solder paste based on the amount of positional misalignment of the solder paste, the screen mask inspection device is allowed to perform inspection of the screen mask by using the amount of positional misalignment detected by this function. This increases the efficiency of processing relating to an inspection of the screen mask or an inspection of the solder paste.

Aspect 3. In the screen mask inspection device described in Aspect 2, the solder position information detection unit may detect information based on an amount of positional misalignment along a moving direction of a squeegee with regard to a solder paste located at one end along the moving direction on the substrate and based on an amount of positional misalignment along the moving direction with regard to a solder paste located at other end along the moving direction on the substrate, as the position information.

In other words, according to Aspect 3, there is provided a screen mask inspection device configured to perform inspection of a screen mask provided with a screen opening that forms a printing pattern and configured to print a solder paste on a substrate via the screen opening. The screen mask inspection device comprises a solder position information detection unit configured to detect position information of a solder paste printed on the substrate; and an in-use measure determination unit configured to perform good/bad quality judgment with regard to the screen mask in a printing process, based on the position information detected by the solder position information detection unit. The solder position information detection unit detects information based on an amount of positional misalignment along a moving direction of a squeegee, of a solder paste located at one end along the moving direction on the substrate relative to a predetermined reference position and based on an amount of positional misalignment along the moving direction, of a solder paste located at other end along the moving direction on the substrate relative to a predetermined reference position, as the position information.

Solder pastes are printed on the substrate by moving a predetermined squeegee along a surface of the screen mask while pressing the squeegee against the surface of the screen mask. The configuration of Aspect 3 detects information based on the amount of positional misalignment of the solder paste along the moving direction of the squeegee, as the position information of the solder paste. This configuration enables good/bad quality judgment with regard to the screen mask to be performed, based on information that strongly reflects the effect of the moving squeegee and that more explicitly expresses a degree of deformation or positional misalignment in the screen mask. This ensures an inspection with the higher accuracy to determine whether the screen mask is in such a state that the solder paste is appropriately printable.

Furthermore, the configuration of the above aspect uses the information (for example, a difference between the respective amounts of positional misalignment) based on the amount of positional misalignment with regard to the solder paste located at one end along the moving direction of the squeegee and based on the amount of positional misalignment with regard to the solder paste located at the other end along the moving direction, as the position information of the solder paste. In other words, information based on the respective amounts of positional misalignment of the respective solder pastes located at positions away from each other along the moving direction of the squeegee, as the position information of the solder paste. Accordingly, this causes the position information of the solder paste to more distinctively indicate the degree of deformation or positional misalignment in the screen mask and further enhances the accuracy of inspection.

Aspect 4. In the screen mask inspection device described in Aspect 1, the solder position information detection unit may detect information showing a distance between a plurality of solder pastes on the substrate, as the position information.

The configuration of Aspect 4 detects information showing a distance between a plurality of solder pastes, as the position information of the solder paste. This configuration enables the position information required for the good/bad quality judgment to be readily obtained and reduces the load relating to an inspection process.

One available configuration may detect information showing a distance between a solder paste located at one end along a moving direction of a squeegee on the substrate and a solder paste located at the other end along the moving direction on the substrate, as the position information of the solder paste. Like Aspect 3 described above, this configuration provides the position information of the solder paste that strongly reflects the effect of the squeegee, thus enhancing the accuracy of inspection.

Aspect 5. The screen mask inspection device described in any of Aspects 1 to 4 may further comprise an opening position information detection unit configured to detect position information of the screen opening in a non-printing state of the solder paste; and an individual good/bad quality determination unit configured to perform good/bad quality judgment of the screen mask itself and good/bad quality judgment of an external factor that affects the screen mask in the printing process, based on the position information of the solder paste detected by the solder position information detection unit and the position information of the screen opening detected by the opening position information detection unit.

The "position information of the screen opening" may be, for example, information with regard to a relative position of an actual screen opening (for example, an amount of positional misalignment) relative to a predetermined mask reference position (for example, an ideal (designed) position of a screen opening or information showing a distance between a plurality of screen openings. In another example, information indirectly indicating the position of a screen opening (for example, information with regard to the position of a predetermined mark provided in the screen mask) may be used as the "position information of the screen opening" (the same applies to Aspect 12 described later).

The configuration of Aspect 5 determines the good/bad quality of the screen mask itself and the good/bad quality of the external factor affecting the screen mask in the printing process, based on the position information of the solder paste and the position information of the screen opening. For example, when neither the position information of the solder paste nor the position information of the screen opening meets each predetermined good quality condition, it is determinable that the screen mask itself is defective. When the position information of the solder paste does not meet the good quality condition but the position information of the screen opening meets the good quality condition, on the other hand, it is determinable that the screen mask itself is non-defective but there may be the external factor affecting the screen mask in the printing process (for example, a pressing force against the substrate or a force applied from the squeegee (squeegee pressure)). This configuration accordingly enables a cause for the screen mask in such a state that the solder paste is not appropriately printable, to be perceived more accurately. As a result, this configuration enables an appropriate measure to be more readily selected and specified among a plurality of possible measures against a printing failure (for example, replacing the screen mask or changing a printing condition) and thereby enables the specified measure to be taken more promptly.

Aspect 6. The screen mask inspection device described in Aspect 5 may further comprise an information transmission unit configured to transmit information that demands replacement of the screen mask (i.e., information that prompts a user to replace the screen mask) or information that demands changing a printing condition affecting the screen mask (i.e., information that prompts the user to change the printing condition), based on a result of determination by the individual good/bad quality determination unit.

The configuration of Aspect 6 transmits (provides) information that demands replacement of the screen mask or information that demands changing a printing condition affecting the screen mask (for example, the squeegee pressure or the pressing force against the substrate), based on the result of determination by the individual good/bad quality determination unit. This configuration enables an operator to promptly and accurately perceive a measure that is to be taken, when the screen mask in the printing process is determined to be defective. As a result, this enables the measure to be taken more promptly and thereby enhances the production efficiency.

Aspect 7. There is provided a solder printing inspection device, comprising: the screen mask inspection device described in any of Aspects 1 to 6; and a solder inspection unit configured to perform inspection of the solder paste printed on the substrate.

The configuration of Aspect 7 has similar functions and advantageous effects to those of Aspect 1 described above.

Aspect 8. There is provided a method for inspecting a screen mask provided with a screen opening that forms a printing pattern and configured to print a solder paste on a substrate via the screen opening. The method for inspecting the screen mask comprises detecting position information of a solder paste printed on the substrate; and performing good/bad quality judgment with regard to the screen mask in a printing process, based on a result of the detecting.

The configuration of Aspect 8 has similar functions and advantageous effects to those of Aspect 1 described above.

Aspect 9. In the method for inspecting the screen mask described in Aspect 8, the detecting the position information may comprise detecting information based on an amount of positional misalignment of an actually printed solder paste relative to a predetermined reference position, as the position information.

The configuration of Aspect 9 has similar functions and advantageous effects to those of Aspect 2 described above.

Aspect 10. In the method for inspecting the screen mask described in Aspect 9, the detecting the position information may comprise detecting information based on an amount of positional misalignment along a moving direction of a squeegee with regard to a solder paste located at one end along the moving direction on the substrate and based on an amount of positional misalignment along the moving direction with regard to a solder paste located at other end along the moving direction on the substrate, as the position information.

In other words, according to Aspect 10, there is provided a method for inspecting a screen mask provided with a screen opening that forms a printing pattern and configured to print a solder paste on a substrate via the screen opening. The method for inspecting the screen mask comprises detecting position information of a solder paste printed on the substrate; and performing good/bad quality judgment with regard to the screen mask in a printing process, based on a result of the detecting. The detecting the position information comprises detecting information based on an amount of positional misalignment along a moving direction of a squeegee, of a solder paste located at one end along the moving direction on the substrate relative to a predetermined reference position and based on an amount of positional misalignment along the moving direction, of a solder paste located at other end along the moving direction on the substrate relative to a predetermined reference position, as the position information.

The configuration of Aspect 10 has similar functions and advantageous effects to those of Aspect 3 described above.

Aspect 11. In the method for inspecting the screen mask described in Aspect 8, the detecting the position information may comprise detecting information showing a distance between a plurality of solder pastes on the substrate, as the position information.

The configuration of Aspect 11 has similar functions and advantageous effects to those of Aspect 4 described above.

Aspect 12. The method for inspecting the screen mask described in any of Aspects 8 to 11 may further comprise detecting position information of the screen opening in a non-printing state of the solder pastes; and performing good/bad quality judgment of the screen mask itself and good/bad quality judgment of an external factor that affects the screen mask in a printing process, based on the position information of the solder paste and the position information of the screen opening.

The configuration of Aspect 12 has similar functions and advantageous effects to those of Aspect 5 described above.

BRIEF DESCRIPTION OF DRAWINGS

FIG. 8 is a schematic plan view showing a printed circuit board to illustrate position information of solder pastes;

FIG. 9 is a schematic plan view showing a screen mask to illustrate position information of screen openings;

DETAILED DESCRIPTION OF EMBODIMENTS

The following describes embodiments with reference to drawings. The configuration of a printed circuit board 1 is described first with reference to FIG. 1. According to one or more embodiments, the printed circuit board 1 corresponds to the "substrate".

Figure 1:
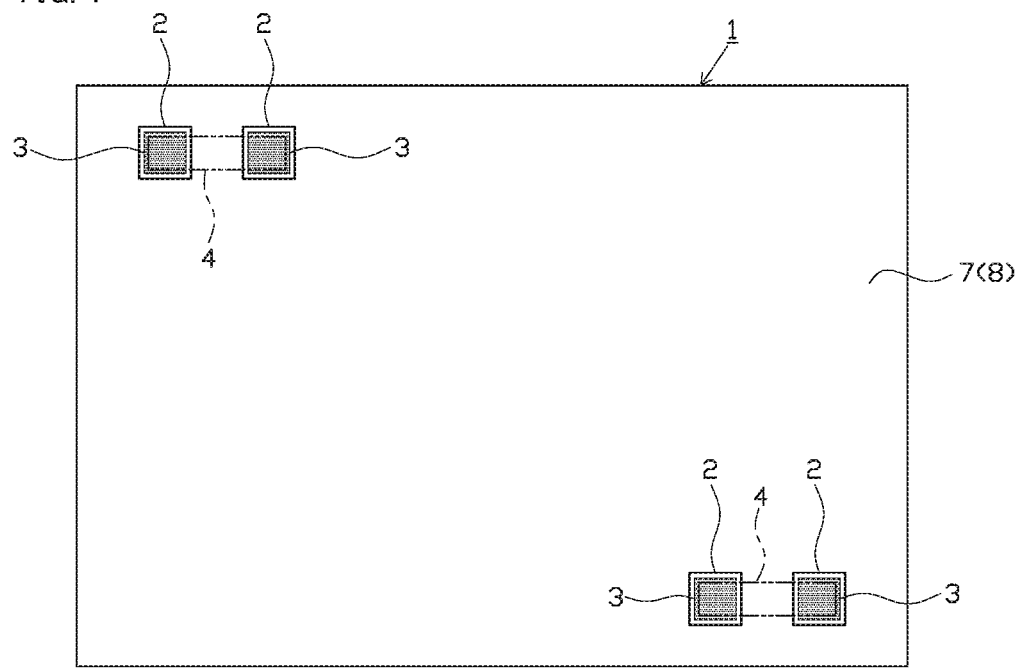
FIG. 1 is a schematic plan view illustrating a printed circuit board.

As shown in FIG. 1, the printed circuit board 1 has a wiring pattern (not shown) made of copper foil and a plurality of lands formed on a flat plate-like base board 7 made of, for example, a glass epoxy resin. A residual area of the base board 7 other than the lands 2 is coated with a resist film 8 (shown in FIG. 5). Solder pastes 3 having viscosity (areas shown by a dotted pattern in FIG. 1 and the like) are printed on the respective lands 2. An electronic component 4 such as a chip is bonded to the solder pastes 3. FIG. 1 schematically illustrates only a small portion of a plurality of the lands 2 and the like.

Figure 2:
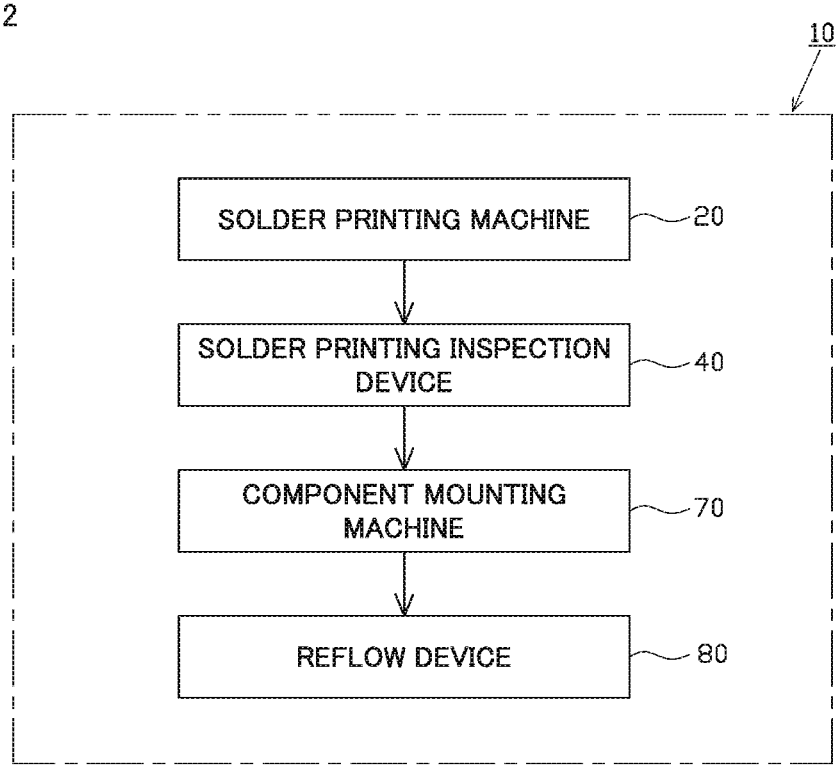
FIG. 2 is a block diagram illustrating the schematic configuration of a production line.

A production line for manufacturing the printed circuit board 1 is described next with reference to FIG. 2. FIG. 2 is a block diagram illustrating the schematic configuration of a production line 10 for the printed circuit board 1. In the production line 10, a solder printing machine 20, a solder printing inspection device 40, a component mounting machine 70 and a reflow device 80 are provided sequentially from an upstream side thereof. The component mounting machine 70 and the reflow device 80 are first described briefly, and the solder printing machine 20 and the solder printing inspection device 40 are then described in detail.

The component mounting machine 70 mounts the electronic component 4 (shown in FIG. 1) on the solder pastes 3 printed by the solder printing machine 20. The electronic component 4 has a plurality of electrodes and leads (none of them are shown), which are respectively bonded temporarily to predetermined solder pastes 3.

The reflow device 80 heats and melts the solder pastes 3 to solder join the lands 2 with the electrodes and the leads of the electronic component 4 (soldering).

Figure 3:
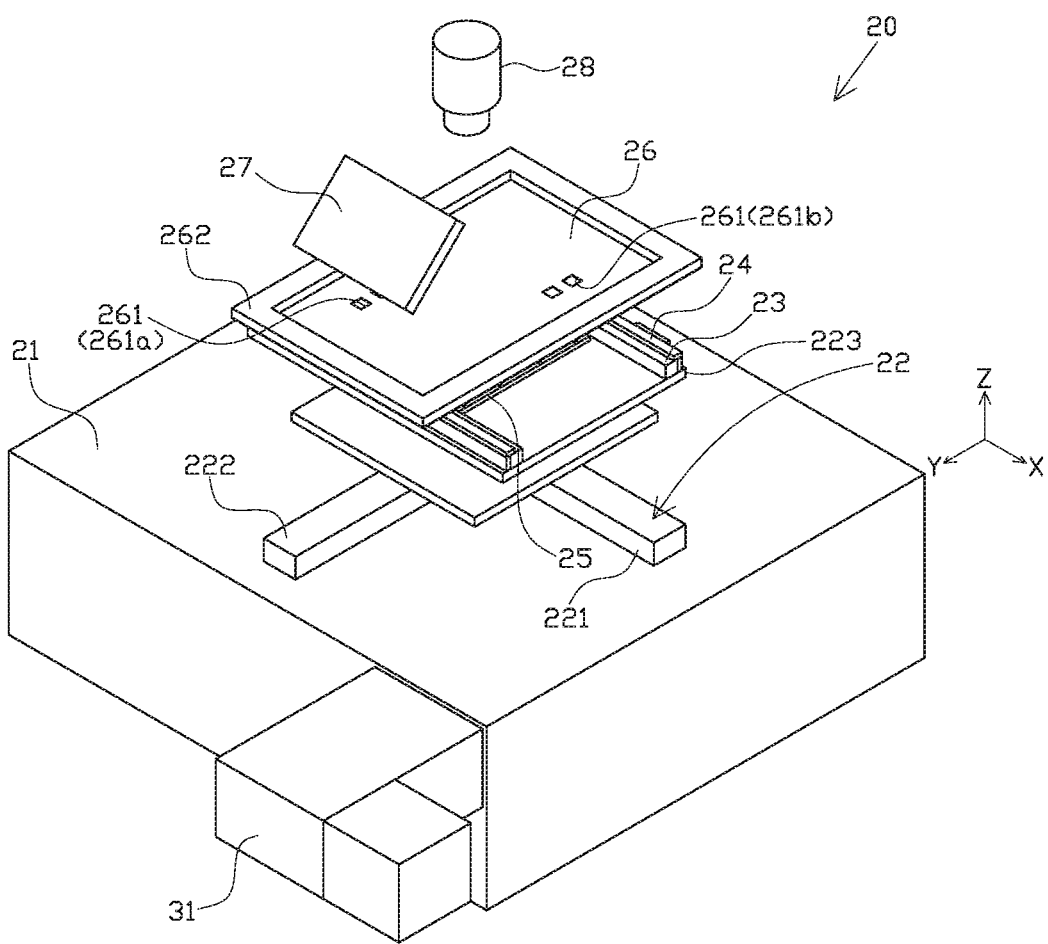
FIG. 3 is a schematic perspective view illustrating the schematic configuration of a solder printing machine.
Figure 4:
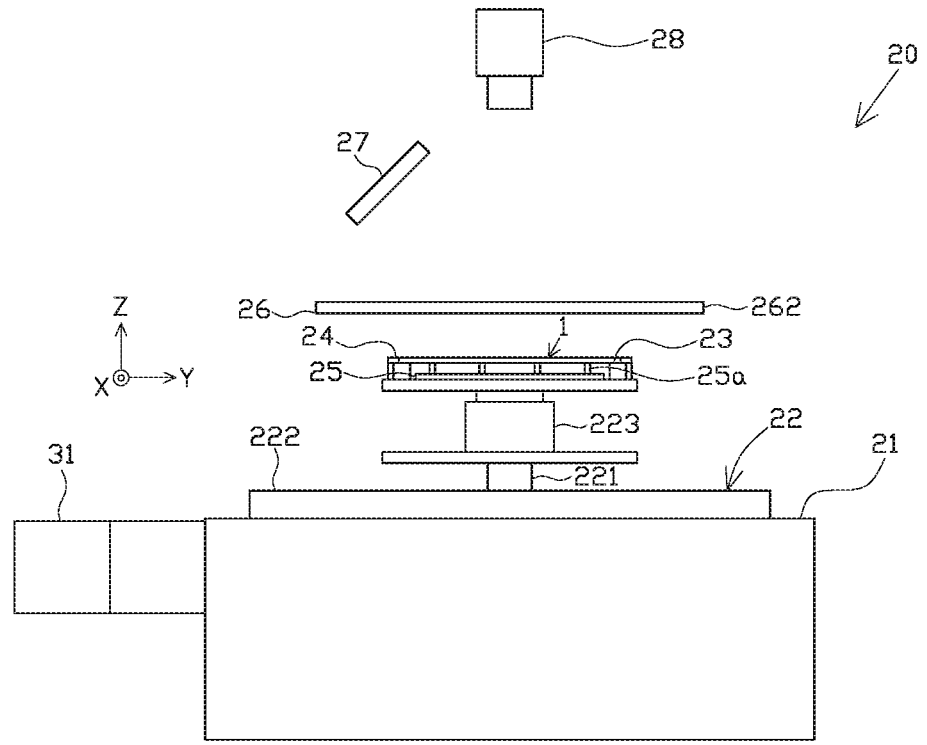
FIG. 4 is a schematic side view illustrating the schematic configuration of the solder printing machine.

The solder printing machine 20 is described next. The solder printing machine 20 prints a predetermined amount of solder paste 3 on each of the lands 2 of the printed circuit board 1. As shown in FIG. 3 and FIG. 4, the solder printing machine 20 includes a printing moving mechanism 22, a printing rail mechanism 23, a chuck mechanism 24, a substrate support device 25, a screen mask 26, a squeegee 27, a mask camera 28, a printing display device 29 (shown in FIG. 6), a printing input device 30 (shown in FIG. 6) and a printing control device 31.

The printing moving mechanism 22 is a mechanism configured to move the printed circuit board 1 in a process of printing the solder pastes 3 and is placed on a predetermined base 21. The printing moving mechanism 22 includes an X-axis moving mechanism 221, a Y-axis moving mechanism 222 and a Z-axis moving mechanism 223. Actuation of the X-axis moving mechanism 221 and the Y-axis moving mechanism 222 causes the printing rail mechanism 23 and the Z-axis moving mechanism 223 to be slid and moved along an X-axis direction and a Y-axis direction. Actuation of the Z-axis moving mechanism 223 causes the printing rail mechanism 23 to be moved along a Z-axis direction (height direction).

The printing rail mechanism 23 is a mechanism configured to cause the printed circuit board 1 as a printing object of the solder pastes 3 to be mounted thereon. The printing rail mechanism 23 includes a pair of rails arranged to be parallel to each other and configured to have a changeable interval and is applicable to various printed circuit boards 1 having different widths by changing the interval between these rails. The printing rail mechanism 23 is moved along the X-axis direction, the Y-axis direction and the Z-axis direction by the operation of the printing moving mechanism 22. Moving the printing rail mechanism 23 causes the printed circuit board 1 mounted on the printing rail mechanism 23 to be moved in any arbitrary direction (the X-axis direction, the Y-axis direction and the Z-axis direction).

The chuck mechanism 24 is a mechanism configured to hold the printed circuit board 1 and thereby suppress the printed circuit board 1 from being moved in the process of printing the solder pastes 3. The chuck mechanism 24 includes a pair of attachable and detachable holding elements. These holding elements grip the printed circuit board 1, so as to hold the printed circuit board 1 mounted on the printing rail mechanism 23.

The substrate support device 25 supports the printed circuit board 1 upward to suppress deformation of the printed circuit board 1 in the process of printing the solder pastes 3. The substrate support device 25 is placed between the two rails of the printing rail mechanism 23 and has a large number of rod-like support pins 25a. Leading end portions of these support pins 25a come into contact with a lower surface of the printed circuit board 1, so as to support the printed circuit board 1.

The screen mask 26 is used to form a printing pattern of the solder pastes 3 on the printed circuit board 1. The screen mask 26 has a thin-wall flat plate-like shape and is made of, for example, a predetermined metal (stainless steel or the like). The constituent material of the screen mask 26 may, however, be changed appropriately.

The screen mask 26 includes a plurality of screen openings 261 that are pierced in a thickness direction thereof to have a shape corresponding to a printing pattern. In the process of printing the solder pastes 3, the solder pastes 3 enter the screen openings 261, so that the solder pastes 3 are printed on the printed circuit board 1 via (through) the screen opening 261. Only part of the plurality of screen openings 261 is schematically illustrated in FIG. 3 and other drawings.

An entire outer circumference of the screen mask 26 is held by a rectangular frame 262. The screen mask 26 receives a tensile force from the frame 262 to be stretched without slack.

The squeegee 27 is a spatula component to spread the solder paste 3 placed on the screen mask 26. The squeegee 27 is held by a predetermined squeegee holding element (not shown). The squeegee holding element is configured to be movable in any arbitrary direction (the X-axis direction, the Y-axis direction and the Z-axis direction) by a predetermined drive unit (not shown).

The mask camera 28 is configured by, for example, a predetermined imaging device such as a CCD camera and is used to take an image of the screen mask 26. According to one or more embodiments, the mask camera 28 is configured to take an image of an entire area of the screen mask 26. Accordingly, the mask camera 28 is allowed to take an image of a screen opening 261 located at one end along a moving direction of the squeegee 27 (along the Y-axis direction according to one or more embodiments) (referred to as "one end-side screen opening 261a") and to take an image of a screen opening 261 located on the other end along the moving direction (referred to as "the other end-side screen opening 261b").

Imaging by the mask camera 28 is performed at a timing when the screen mask 26 is away from the printed circuit board 1 and no printing of the solder paste 3 is performed onto the printed circuit board 1. This configuration causes an image of the screen mask 26 to be taken in such a state that the screen mask 26 is not affected by printing. The image data obtained by the mask camera 28 is output to the printing control device 31 and to an inspection control device 50 described later. The mask camera 28 is placed above the screen mask 26 according to one or more embodiments but may be placed below the screen mask 26.

According to one or more embodiments, the solder printing machine 20 is provided with a camera (not shown) configured to take an image of the printed circuit board 1, in addition to the mask camera 28.

The printing display device 29 is configured by, for example, a liquid crystal display or the like and is a device used to display various information stored in the printing control device 31.

The printing input device 30 is configured by, for example, a keyboard or the like and is a device used to input information into the printing control device 31.

The printing control device 31 controls the operations of the respective parts of the solder printing machine 20 (for example, the printing moving mechanism 22 and the mask camera 28). The printing control device 31 is configured by a computer system including, for example, a CPU serving as an arithmetic device, a ROM configured to store various programs, a RAM configured to temporarily store various data such as calculation data and input/output data, and a storage device (for example, a hard disk) configured for long-term storage of information.

Various pieces of information are stored in the printing control device 31. The various pieces of information include various parameters relating to printing of the solder pastes 3. Examples of the various parameters include a moving velocity and a moving direction of the squeegee 27, an angle of inclination of the squeegee 27 to the screen mask 26, a contact pressure (squeegee pressure) of the squeegee 27 against the screen mask 26, a position of the printed circuit board 1 (the printing rail mechanism 23) along the X-axis direction and the Y-axis direction in the process of printing the solder pastes 3, and a pressing force of the screen mask 26 against the printed circuit board 1. The pressing force of the screen mask 26 against the printed circuit board 1 may be changed by regulating the operation of the Z-axis moving mechanism 223.

Figure 6:
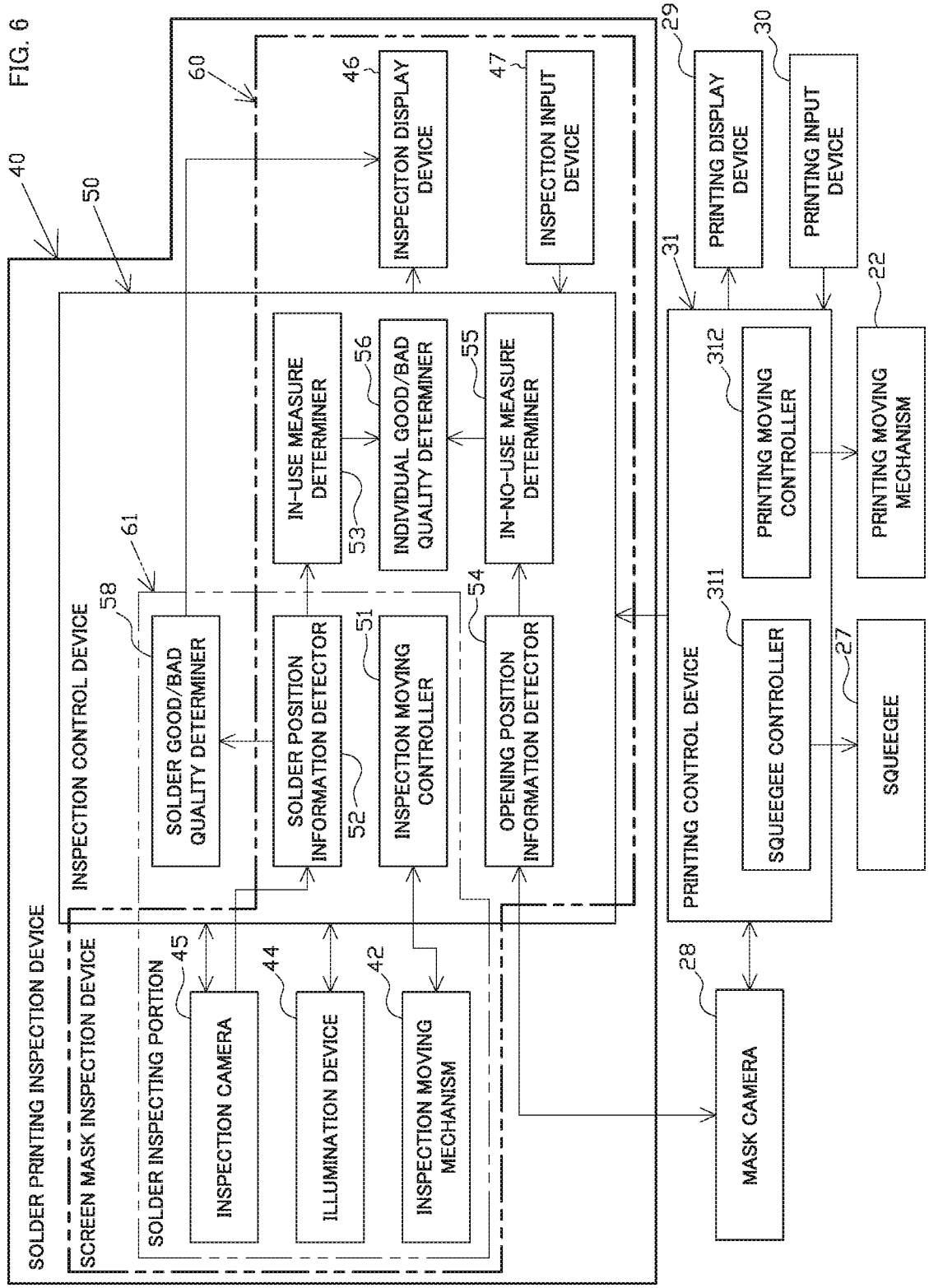
FIG. 6 is a block diagram illustrating the electrical configuration of a solder printing inspection device and others.

The printing control device 31 includes a squeegee controller 311 and a printing moving controller 312 as shown in FIG. 6.

The squeegee controller 311 controls the drive unit for operating the squeegee 27, based on the various parameters stored in the printing control device 31, so as to control the operation of the squeegee 27. The squeegee controller 311 regulates the moving direction, the moving velocity and the squeegee pressure of the squeegee 27. According to one or more embodiments, this configuration causes the squeegee 27 to linearly move along the Y-axis direction from one side in a width direction to the other side in the width direction of the screen mask 26, while being brought into contact with an upper surface of the screen mask 26 under a set squeegee pressure, in the process of printing the solder pastes 3. In the solder printing machine 20, the solder pastes 3 are printed sequentially onto a plurality of printed circuit boards 1 that are sequentially supplied. According to one or more embodiments, the moving direction of the squeegee 27 in the process of printing the solder pastes 3 is configured to be unchanged and fixed with regard to the respective printed circuit boards 1. The moving direction of the squeegee 27 in the process of printing the solder pastes 3 is not limited to the Y-axis direction but may be a direction other than the Y-axis direction (for example, the X-axis direction).

Additionally, information with regard to the moving direction of the squeegee 27 is output from the printing control device 31 to the inspection control device 50 described later.

The printing moving controller 312 controls the operation of the printing moving mechanism 22, based on the various parameters stored in the printing control device 31. According to one or more embodiments, the printing moving controller 312 controls the operation of the printing moving mechanism 22 to perform positioning of the printed circuit board 1 and the screen mask 26 in the X-Y direction, such that the positions of the lands 2 are aligned with the positions of the screen openings 261 to a maximum extent, prior to printing of the solder pastes 3. This positioning is performed, based on image data of the printed circuit board 1 obtained by the camera for imaging the printed circuit board 1 and image data of the screen mask 26 obtained by the mask camera 28.

After positioning of the printed circuit board 1 and the screen mask 26, the printing moving controller 312 controls the operation of the Z-axis moving mechanism 223 to press the screen mask 26 against the printed circuit board 1 by a predetermined pressing force.

In the process of printing the solder pastes 3, the printing moving controller 312 and the printing moving mechanism 22 serve to perform positioning of the screen mask 26 and the printed circuit board 1 in the X-Y direction and move up the printed circuit board 1, so as to press the screen mask 26 against the printed circuit board 1 by a predetermined pressing force. A predetermined solder supply device (not shown) serves to supply the solder paste on an upper surface of the screen mask 26.

Figure 5:
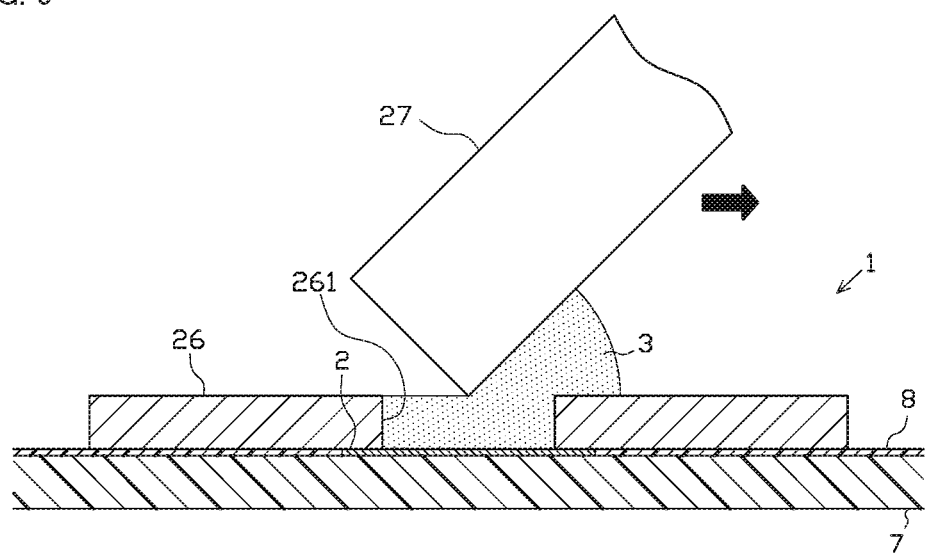
FIG. 5 is a schematic diagram illustrating a printing operation in the solder printing machine.

The squeegee controller 311 subsequently moves the squeegee 27 along a predetermined direction (the Y-axis direction according to one or more embodiments), while causing the squeegee 27 to come into contact with the upper surface of the screen mask 26 under a set squeegee pressure (as shown in FIG. 5). This causes the solder pastes 3 to enter the screen openings 261 and thereby to be printed on the printed circuit board 1. After printing of the solder pastes 3, the printed circuit board 1 is moved down by the printing moving mechanism 22 and the like to be separated and away from the screen mask 26. The printed circuit board 1 with the solder pastes 3 printed thereon is sent to the solder printing inspection device 40 by a predetermined conveyor (not shown) or the like.

Figure 7:
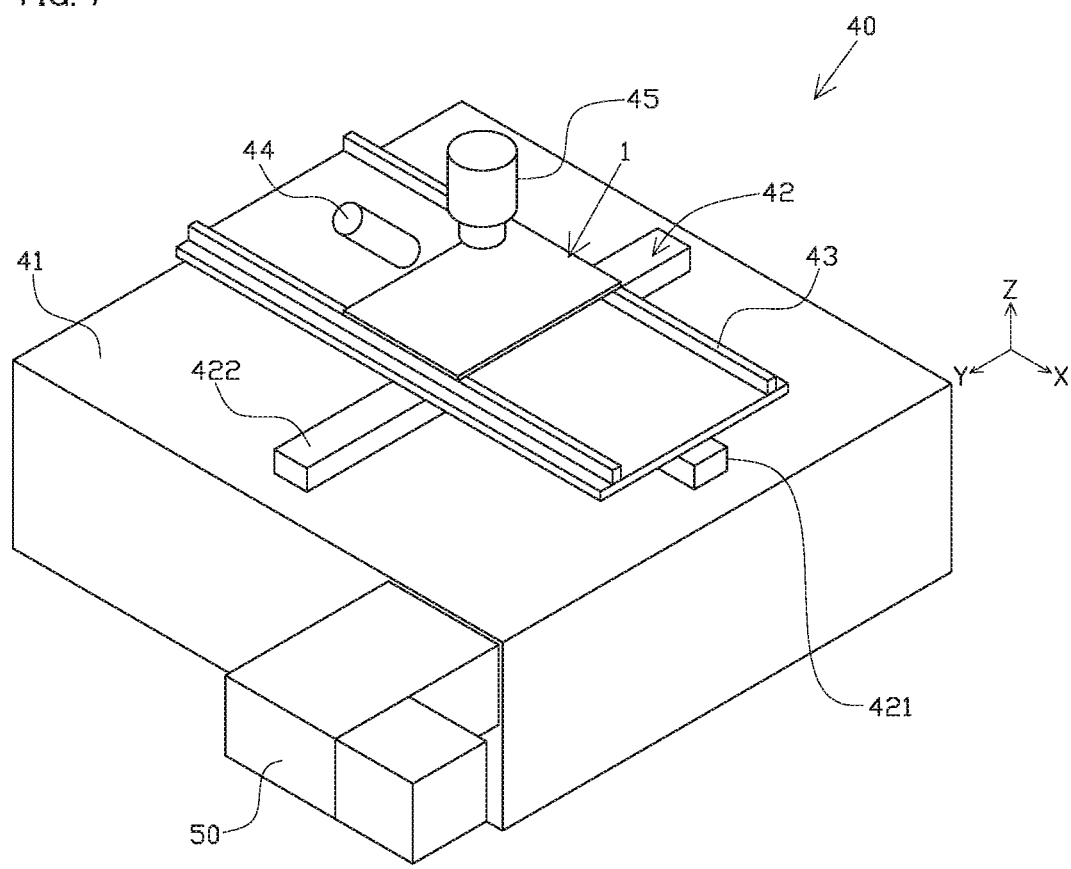
FIG. 7 is a schematic perspective view illustrating the schematic configuration of the solder printing inspection device.

The following describes the solder printing inspection device 40. The solder printing inspection device 40 is configured to perform inspection of the solder pastes 3 printed by the solder printing machine 20 and inspection of the screen mask 26. As shown in FIG. 6 and FIG. 7, the solder printing inspection device 40 includes an inspection moving mechanism 42, an inspection rail mechanism 43, an illumination device 44, an inspection camera 45, an inspection display device 46, an inspection input device 47 and the inspection control device 50.

The inspection moving mechanism 42 is a mechanism configured to move the printed circuit board 1 in a process of performing inspection of the solder pastes 3 or the like and is placed on a predetermined base 41. The inspection moving mechanism 42 includes an X-axis moving mechanism 421 and a Y-axis moving mechanism 422. Actuation of the X-axis moving mechanism 421 and the Y-axis moving mechanism 422 causes the inspection rail mechanism 43 to be slid and moved along an X-axis direction and a Y-axis direction. According to one or more embodiments, the X-axis direction and the Y-axis direction in the solder printing inspection device 40 are identical with the X-axis direction and the Y-axis direction in the solder printing machine 20.

The inspection rail mechanism 43 is a mechanism configured to cause the printed circuit board 1 as an inspection object to be mounted thereon. The inspection rail mechanism 43 includes a pair of rails arranged to be parallel to each other and is applicable to various printed circuit boards 1 having different widths by changing the interval between these rails. The inspection rail mechanism 43 is moved along the X-axis direction and the Y-axis direction by the operation of the inspection moving mechanism 42. Moving the inspection rail mechanism 43 causes the printed circuit board 1 mounted on the inspection rail mechanism 43 to be moved in any arbitrary direction (the X-axis direction and the Y-axis direction).

The illumination device 44 is configured to irradiate an upper surface of the printed circuit board 1 obliquely downward with a predetermined light component pattern.

The inspection camera 45 is configured to take an image of the printed circuit board 1 that is irradiated with the predetermined light component pattern by the illumination device 44. The inspection camera 45 is placed immediately above the printed circuit board 1 and is configured to take an image of an entire area of the printed circuit board 1. Accordingly, the inspection camera 45 is allowed to take an image of a solder paste 3 located at one end along a moving direction of the squeegee 27 (the Y-axis direction according to one or more embodiments) and to take an image of a solder paste 3 located at the other end along the moving direction. Image data obtained by the inspection camera 45 are input into the inspection control device 50.

The inspection display device 46 is configured by, for example, a liquid crystal display or the like and is used to display various information stored in the inspection control device 50. One single display device may be configured to be used as both the printing display device 29 and the inspection display device 46.

The inspection input device 47 is configured by, for example, a keyboard or the like and is a device used to input information into the inspection control device 50. One single input device may be configured to be used as both the printing input device 30 and the inspection input device 47.

The inspection control device 50 is a device configured to control the operations of the respective parts of the solder printing inspection device 40 (for example, the inspection moving mechanism 42 and the inspection camera 45) and to perform processes relating to inspection of the solder pastes 3 and inspection of the screen mask 26. Like the printing control device 31, the inspection control device 50 is configured by a computer system including a CPU, a ROM, a RAM and a storage device.

Various pieces of information are stored in the storage device of the inspection control device 50. The various pieces of information include parameters relating to operation control of the solder printing inspection device 40 in the process of performing inspection, image data obtained by the inspection camera 45 or the mask camera 28, inspection information used for inspection of the solder pastes 3 or for inspection of the screen mask 26, measurement information obtained based on the image data, and inspection result information showing a result of the inspection.

Examples of the inspection information include designed (ideal) positions of solder pastes 3 in the X-axis direction, in the Y-axis direction and in the Z-axis direction, a reference volume value and a reference area value of each solder paste 3, and an acceptable amount of the screen mask 26 relating to deformation or positional misalignment. Examples of the measurement information include a height (for example, a peak height or an average height), an area, a volume value, and a three-dimensional shape of the solder paste 3, as well as "position information of screen openings 261" and "position information of solder pastes 3", which are respectively described later. Examples of the inspection result information include a result of the good/bad quality judgment of the screen mask 26 itself and a result of the good/bad quality judgment of an external factor affecting the screen mask 26 in a printing process (for example, a pressing force of the screen mask 26 against the printed circuit board 1 or a squeegee pressure).

The inspection control device 50 includes an inspection moving controller 51, a solder position information detector 52, an in-use measure determiner 53, an opening position information detector 54, an in-no-use measure determiner 55 and an individual good/bad quality determiner 56. According to one or more embodiments, the solder position information detector 52 configures the "solder position information detection unit". Similarly, the in-use measure determiner 53 configures the "in-use measure determination unit"; the opening position information detector 54 configures the "opening position information detection unit", and the individual good/bad quality determiner 56 configures the "individual good/bad quality determination unit". The inspection control device 50 is also provided with, for example, an illumination controller configured to control the illumination device 44 and an imaging controller configured to control the operation of the inspection camera 45 (neither of them are shown).

The inspection moving controller 51 controls the operation of the inspection moving mechanism 42, based on the parameters stored in the inspection control device 50. Controlling the operation of the inspection moving mechanism 42 causes the printed circuit board 1 to be placed at a position appropriate for the inspection.

The solder position information detector 52 measures the position and the size of each printed solder paste 3, based on the image data obtained by the inspection camera 45. More specifically, the solder position information detector 52 measures amounts of positional misalignment along the X-axis direction and the Y-axis direction of each solder paste 3 relative to the land 2 in the printed circuit board 1. The solder position information detector 52 also measures the height (for example, the peak height or the average height), the area, the volume value and the three-dimensional shape of the solder paste 3 by using a preset three-dimensional measurement technique (for example, a phase shift method) or the like. The information obtained by the solder position information detector 52 is stored as measurement information into the inspection control device 50.

Furthermore, the solder position information detector 52 uses the measured amounts of positional misalignment and information with regard to the moving direction of the squeegee 27 input from the squeegee controller 311 to detect "position information of the solder pastes 3" in the printed circuit board 1.

According to one or more embodiments, the "position information of the solder pastes 3" detected is a difference (b–a) along the moving direction of the squeegee 27 between an amount of positional misalignment a with regard to a solder paste 3 located at one end along the moving direction on the printed circuit board 1 (referred to as "one end-side solder paste 3a") and an amount of positional misalignment b with regard to a solder paste 3 located at the other end along the moving direction on the printed circuit board 1 (referred to as "the other end-side solder paste 3b"), as shown in FIG. 8. In other words, a difference along the moving direction of the squeegee 27 between the respective amounts of positional misalignment a and b of the solder pastes 3a and 3b located at the farthest positions from each other along the moving direction is detected as the "position information of the solder pastes 3". This difference (b–a) corresponds to a deformation amount or an amount of positional misalignment of the screen mask 26 along the moving direction of the squeegee 27 in the process of printing the solder pastes 3.

More specifically, the amounts of positional misalignment a and b are amounts of positional misalignment of actually printed solder pastes 3 relative to a predetermined "reference position" along the moving direction of the squeegee 27. According to one or more embodiments, the center (or the center of gravity) of each land 2 provided on the printed circuit board 1 is used as the "reference position". Amounts of positional misalignment along the moving direction of the squeegee 27 between the center (or the center of gravity) of each land 2 and the center (or the center of gravity) of each solder paste 3 to be printed at the land 2 as a printing object are detected as the amounts of positional misalignment a and b. According to one or more embodiments, an amount of positional misalignment from the "reference position" toward one side (right side in FIG. 8) along the moving direction of the squeegee 27 is expressed as positive "+", and an amount of positional misalignment from the "reference position" toward the other side (left side in FIG. 8) along the moving direction is expressed as negative "–". The "position information of the solder pastes 3" is stored as measurement information into the inspection control device 50.

The in-use measure determiner 53 performs good/bad quality judgment of the screen mask 26 in the printing process, based on the "position information of the solder pastes 3" detected by the solder position information detector 52. More specifically, the in-use measure determiner 53 compares an absolute value of the difference (b–a) detected by the solder position information detector 52 with the acceptable amount stored as the inspection information. When the absolute value of the difference (b–a) is larger than the acceptable amount, i.e., when the deformation amount or the like of the screen mask 26 in the printing process is out of an allowable range, the in-use measure determiner 53 determines that the screen mask 26 in the printing process is defective (is in such a state that the solder pastes 3 are not appropriately printable). When the absolute value of the difference (b–a) is not larger than the acceptable amount, i.e., when the deformation amount or the like of the screen mask 26 in the printing process is in the allowable range, on the other hand, the in-use measure determiner 53 determines that the screen mask 26 in the printing process is non-defective. The result of this determination is stored as inspection result information into the inspection control device 50.

The opening position information detector 54 detects the "position information of the screen openings 261" in the non-printing state of the solder pastes 3, based on the image data obtained by the mask camera 28. According to one or more embodiments, the "position information of the screen openings 261" detected is a difference (y–x) along the moving direction of the squeegee 27 between an amount of positional misalignment x with regard to a screen opening 261 located at one end along the moving direction in the screen mask 26 (one end-side screen opening 261a) and an amount of positional misalignment y with regard to a screen opening 261 located at the other end along the moving direction in the screen mask 26 (the other end-side screen opening 261b), as shown in FIG. 9. This difference (y–x) corresponds to a deformation amount of the screen mask 26 along the moving direction of the squeegee 27 in the non-printing state of the solder pastes 3.

More specifically, the amounts of positional misalignment x and y are amounts of positional misalignment of actual screen openings 261 relative to a predetermined "mask reference position" along the moving direction of the squeegee 27. According to one or more embodiments, the center (or the center of gravity) of each designed (ideal) screen opening 261 is used as the "mask reference position". Amounts of positional misalignment along the moving direction of the squeegee 27 between the center (or the center of gravity) of each designed screen opening 261 and the center (or the center of gravity) of each actual screen opening 261 are detected as the amounts of positional misalignment x and y. According to one or more embodiments, an amount of positional misalignment from the "mask reference position" toward one side (right side in FIG. 9) along the moving direction of the squeegee 27 is expressed as positive "+", and an amount of positional misalignment from the "mask reference position" toward the other side (left side in FIG. 9) along the moving direction is expressed as negative "–". The "position information of the screen openings 261" is stored as measurement information into the storage device of the inspection control device 50.

The in-no-use measure determiner 55 performs good/bad quality judgment of the screen mask 26 in the non-printing state (i.e., in the state that the screen mask 26 is not in contact with the squeegee 27 or the printed circuit board 1), based on the "position information of the screen openings 261" detected by the opening position information detector 54. More specifically, the in-no-use measure determiner 55 compares an absolute value of the difference (y–x) detected by the opening position information detector 54 with the acceptable amount stored as the inspection information. When the absolute value of the difference (y−x) is larger than the acceptable amount, i.e., when the deformation amount of the screen mask 26 in the non-printing state is out of an allowable range, the in-no-use measure determiner 55 determines that the screen mask 26 in the non-printing state is defective. When the absolute value of the difference (y−x) is not larger than the acceptable amount, i.e., when the deformation amount of the screen mask 26 in the non-printing state is in the allowable range, on the other hand, the in-no-use measure determiner 55 determines that the screen mask 26 in the non-printing state is non-defective. The result of the good/bad quality judgment of the screen mask 26 in the non-printing state is stored as inspection result information into the storage device of the inspection control device 50.

The individual good/bad quality determiner 56 performs good/bad quality judgment of the screen mask 26 itself and good/bad quality judgment of the external factor affecting the screen mask 26 in the printing process (for example, the pressing force of the screen mask 26 against the printed circuit board 1 or the squeegee pressure), based on the "position information of the solder pastes 3" detected by the solder position information detector 52 and the "position information of the screen openings 261" detected by the opening position information detector 54. According to one or more embodiments, the individual good/bad quality determiner 56 performs the good/bad quality judgment of the screen mask 26 itself and the good/bad quality judgment of the external factor, based on the results of determination by the in-use measure determiner 53 and by the in-no-use measure determiner 55.

More specifically, when the results of the determination by both the in-use measure determiner 53 and the in-no-use measure determiner 55 are good results, the individual good/bad quality determiner 56 determines that the screen mask 26 itself is non-defective and that the external factor is appropriate.

When the results of the determination by both the in-use measure determiner 53 and the in-no-use measure determiner 55 are bad results, the individual good/bad quality determiner 56 determines that the screen mask 26 itself is defective.

When the result of the determination by the in-use measure determiner 53 is a bad result but the result of the determination by the in-no-use measure determiner 55 is a good result, on the other hand, the individual good/bad quality determiner 56 determines that the screen mask 26 itself is non-defective but that the external factor, such as the squeegee pressure, is inappropriate.

When the result of the determination by the in-use measure determiner 53 is a good result but the result of the determination by the in-no-use measure determiner 55 is a bad result, the individual good/bad quality determiner 56 performs predetermined abnormality determination (for example, determination of that "there is an abnormality in detection of the positions of the solder pastes 3" The results of the determination by the individual good/bad quality determiner 56 are stored as inspection result information into the inspection control device 50.

Furthermore, when it is determined that the screen mask 26 itself is defective, the individual good/bad quality determiner 56 generates information that demands replacement of the screen mask 26 and outputs a signal with regard to this information to the inspection display device 46. This causes information that demands replacement of the screen mask 26 to be transmitted by (displayed on) the inspection display device 46.

When it is determined that the external factor affecting the screen mask 26 in the printing process is inappropriate, on the other hand, the individual good/bad quality determiner 56 generates information that demands changing a condition relating to printing of the solder pastes 3 and outputs a signal with regard to this information to the inspection display device 46. This causes information that demands changing a printing condition affecting the screen mask 26 (for example, the pressing force of the screen mask 26 against the printed circuit board 1 or the squeegee pressure) to be transmitted by (displayed on) the inspection display device 46. According to one or more embodiments, the inspection display device 46 configures the "information transmission unit".

A device configured to output information by voice may be used as the "information transmission unit". A mobile terminal or personal digital assistance equipped with the function of receiving signals with regard to the respective pieces of information described above and transmitting these pieces of information to an operator by wireless communication may be used as the "information transmission unit".

According to one or more embodiments, the inspection moving mechanism 42, the illumination device 44, the inspection camera 45, the inspection display device 46, the inspection input device 47, the inspection moving controller 51, the solder position information detector 52, the in-use measure determiner 53, the opening position information detector 54, the in-no-use measure determiner 55 and the individual good/bad quality determiner 56 constitute a screen mask inspection device 60 (shown in FIG. 6) configured to perform inspection of the screen mask 26.

The inspection control device 50 further includes a solder good/bad quality determiner 58. The solder good/bad quality determiner 58 compares the measurement information with regard to the solder pastes 3 obtained by the solder position information detector 52 with the inspection information and performs good/bad quality judgement of the printing condition of each solder paste 3 with respect to each land 2 (including a solder bridge or the like formed between a plurality of lands 2). According to one or more embodiments, the good/bad quality judgment includes, for example, determination of whether each of a peak height, an average height, an area, a volume, an amount of positional misalignment along the X-axis direction and an amount of positional misalignment along the Y-axis direction (including the amounts of positional misalignment a and b) satisfies a criterion, determination of whether no solder paste 3 blurs and determination of whether there is any "no-solder" state where the solder paste 3 is missing. The results of the good/bad quality judgment are stored as inspection result information into the inspection control device 50 and may be displayed on the inspection display device 46. The printed circuit board 1 determined as normal or good printing state of the solder pastes 3 is guided to the component mounting machine 70 on the downstream side, whereas the printed circuit board 1 determined as abnormal or bad printing state of the solder pastes 3 is discharged by a predetermined defective discharge device (not shown).

According to one or more embodiments, the inspection moving mechanism 42, the illumination device 44, the inspection camera 45, the inspection moving controller 51, the solder position information detector 52 and the solder good/bad quality determiner 58 constitute a solder inspecting portion (or a solder inspection device) 61 configured to perform inspection of the solder pastes 3 printed on the printed circuit board 1. The solder inspecting portion 61 corresponds to the "solder inspection unit".

Figure 10:
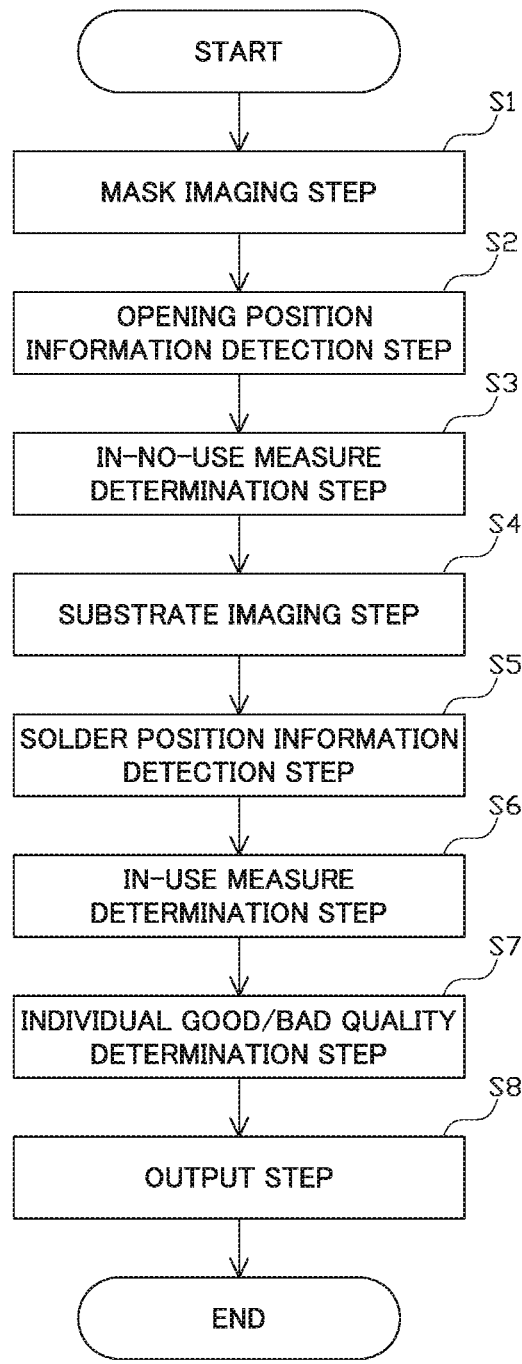
FIG. 10 is a flowchart showing an inspection method of the screen mask.

The following describes an inspection method of the screen mask 26 with reference to FIG. 10. At a mask imaging step of step S1, the inspection method first uses the mask camera 28 to take an image of the screen mask 26 in the non-printing state of the solder pastes 3 and in the state that the screen mask 26 is separated and away from the printed circuit board 1. The image data with regard to the screen mask 26 is output to the inspection control device 50 and the like.

At an opening position information detection step of step S2, the inspection method subsequently uses the opening position information detector 54 to detect the "position information of the screen openings 261" (y–x) in the non-printing state of the solder pastes 3, based on the image data obtained at step S1.

At an in-no-use measure determination step of subsequent step S3, the inspection method uses the in-no-use measure determiner 55 to perform good/bad quality judgment with regard to the screen mask 26 in the non-printing state, based on the result of the detection obtained at step S2. This determines the good/bad quality of the screen mask 26 alone.

At a substrate imaging step of step S4, the inspection method uses the inspection camera 45 to take an image of the printed circuit board 1 with the solder pastes 3 printed thereon. The obtained image data with regard to the printed circuit board 1 is output to the inspection control device 50.

At a solder position information detection step of step S5, the inspection method subsequently uses the solder position information detector 52 to detect the "position information of the solder pastes 3" (b–a), based on the image data obtained at step S4.

At an in-use measure determination step of step S6, the inspection method uses the in-use measure determiner 53 to perform good/bad quality judgment with regard to the screen mask 26 in the printing process, based on the result of the detection obtained at step S5. This determines the good/bad quality of the screen mask 26 by taking into consideration the external factor in the printing process. The processing of steps S1 to S3 may be performed simultaneously with or subsequent to the processing of steps S4 to S6.

At an individual good/bad quality determination step of step S7, the inspection method uses the individual good/bad quality determiner 56 to perform good/bad quality judgment of the screen mask 26 itself and good/bad quality judgment of the external factor affecting the screen mask 26 in the printing process, based on the results of the determination with regard to the screen mask 26 in the printing process and in the non-printing state, i.e., based on the respective results of determination at steps S3 and S6.

At an output step of step S8, the inspection method outputs a signal corresponding to the results of determination at step S7 to the inspection display device 46. In response to output of this signal, the inspection display device 46 transmits (displays) information that demands replacement of the screen mask 26 or information that demands changing the printing condition affecting the screen mask 26.

As described above in detail, the configuration of one or more embodiments detects the "position information of the solder pastes 3" and performs the good/bad quality judgment with regard to the screen mask 26 in the printing process, based on the detected position information. The configuration uses the position information of the printed solder pastes 3 to determine the good/bad quality of the screen mask 26 in the printing process by taking into consideration an external factor affecting the screen mask 26 in the printing process, for example, a pressing force against the printed circuit board 1 or a force applied from the squeegee 27, as well as the screen mask 26 itself. Accordingly, this configuration ensures an inspection with the higher accuracy to determine whether the screen mask 26 is in such a state that the solder pastes 3 are appropriately printable.

Furthermore, the configuration of one or more embodiments detects the information based on the amounts of positional misalignment a and b of the solder pastes 3, as the "position information of the solder pastes 3". Accordingly, this configuration readily obtains the position information required for the good/bad quality judgment and reduces the load involved in the inspection process.

Moreover, the configuration of one or more embodiments uses the difference between the amounts of positional misalignment a and b along the moving direction of the squeegee 27, as the "position information of the solder pastes 3". In other words, information having a component along the moving direction of the squeegee 27 is used as the "position information of the solder pastes 3". This configuration accordingly obtains position information that strongly reflects the effects of the moving squeegee 27 and that more explicitly indicates a degree of deformation or positional misalignment in the screen mask 26. This configuration thus ensures an inspection with high accuracy to determine whether the screen mask 26 is in such a state that the solder pastes 3 are appropriately printable.

More specifically, the configuration of one or more embodiments uses the difference between the respective amounts of positional misalignment a and b of the one end-side solder paste 3a and the other end-side solder paste 3b that are located at the positions away from each other along the moving direction of the squeegee 27, as the "position information of the solder pastes 3". Accordingly, this causes the "position information of the solder pastes 3" to more distinctively indicate the degree of deformation or positional misalignment in the screen mask 26 and further enhances the accuracy of inspection.

Furthermore, the screen mask inspection device 60 is provided in the solder printing inspection device 40 that is equipped with the solder inspecting portion 61 configured to determine the good/bad quality of the solder pastes 3 based on the amounts of positional misalignment a and b. The screen mask inspection device 60 thus enables an inspection of the screen mask 26 to be performed, based on the amounts of positional misalignment a and b used for the good/bad quality judgment by the solder inspecting portion 61. Accordingly, this configuration increases the efficiency of the processing relating to the inspection of the screen mask 26 and the inspection of the solder pastes 3.

The configuration of one or more embodiments performs the good/bad quality judgment of the screen mask 26 itself and the good/bad quality judgment of the external factor affecting the screen mask 26 in the printing process, based on the "position information of the solder pastes 3" and the "position information of the screen openings 261". This enables a cause for the screen mask 26 in such a state that the solder pastes 3 are not appropriately printable, to be perceived more accurately. As a result, this configuration enables an appropriate measure to be more readily selected and specified among a plurality of possible measures against a printing failure (for example, replacing the screen mask 26 or changing a printing condition) and thereby enables the specified measure to be taken more promptly.

Moreover, the configuration of one or more embodiments transmits the information that demands replacement of the screen mask 26 or the information that demands changing the printing condition affecting the screen mask 26, based on the results of the determination by the individual good/bad quality determiner 56. This enables an operator to promptly and accurately perceive a measure that is to be taken, when the screen mask 26 in the printing process is determined to be defective. As a result, this enables the measure to be taken more promptly and thereby enhances the production efficiency.

The present disclosure is not limited to the description of the above embodiments but may be implemented, for example, by configurations described below. The present disclosure may also be naturally implemented by applications and modifications other than those illustrated below.

(a) The configuration of the embodiments described above uses the difference (b−a) between the respective amounts of positional misalignment, as the information based on the amount of positional misalignment a of the one end-side solder paste 3a and the amount of positional misalignment b of the other end-side solder paste 3b. The information based on the respective amounts of positional misalignment a and b is, however, not limited to such embodiments. A sum of absolute values of the respective amounts of positional misalignment a and b or a mean value of these absolute values may accordingly be used as the information based on the respective amounts of positional misalignment a and b.

Information based on amounts of positional misalignment of any two solder pastes 3 other than these solder pastes 3a and 3b on the printed circuit board 1 (for example, a difference between respective amounts of positional misalignment of any two solder pastes 3) may be used as the "position information of the solder pastes 3". Additionally, information based on an amount of positional misalignment with regard to any one solder paste 3 may be used as the "position information of the solder pastes 3". Information based on amounts of positional misalignment with regard to three or more solder pastes 3 may also be naturally used as the "position information of the solder pastes 3".

Figure 11:
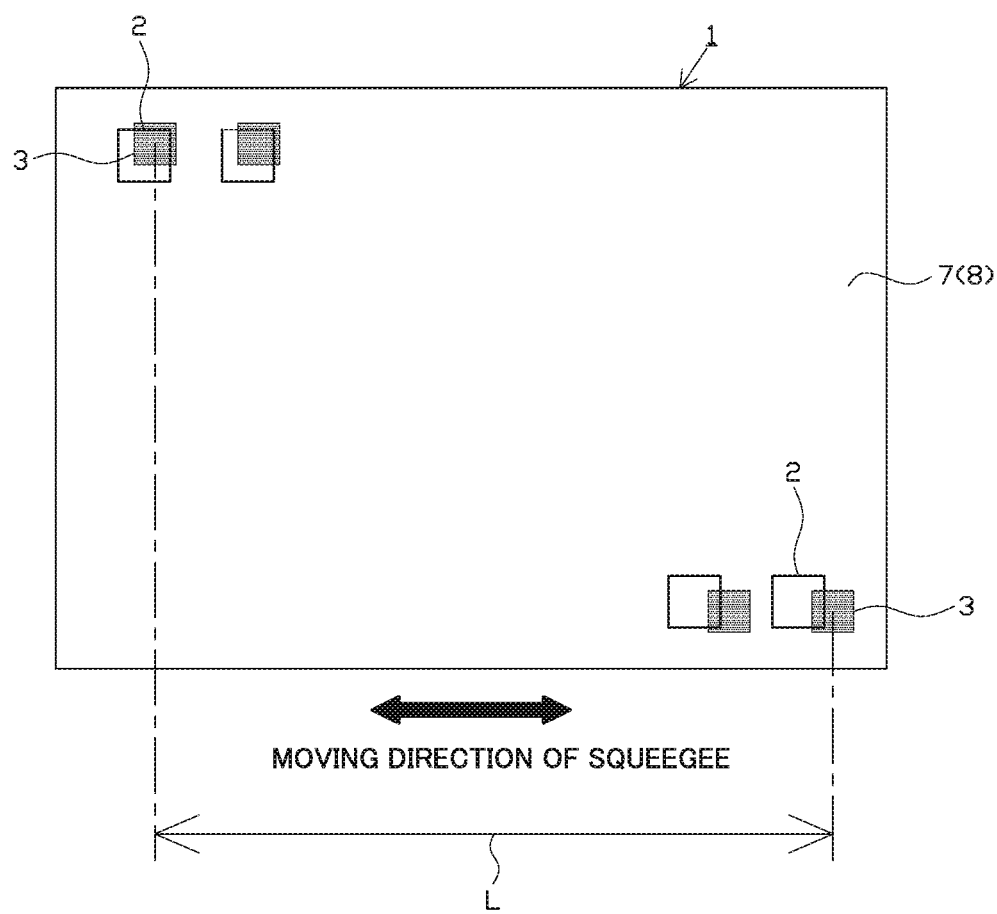
FIG. 11 is a schematic plan view showing a printed circuit board to illustrate position information of solder pastes according to one or more embodiments.

Furthermore, a modification may be configured to detect information showing a distance between solder pastes 3 on the printed circuit board 1, as the "position information of the solder pastes 3". For example, as shown in FIG. 11, a modification may be configured to detect a distance L between the one end-side solder paste 3a and the other end-side solder paste 3b along the moving direction of the squeegee 27 (for example, a distance between respective centers of the solder pastes 3a and 3b), as the "position information of the solder pastes 3". This modified configuration also enables position information required for the good/bad quality judgment to be readily obtained and reduces the load relating to the inspection process. A distance between a plurality of solder pastes 3 different from the solder pastes 3a and 3b described above may be detected as the "position information of the solder pastes 3".

The configuration of the above embodiments uses the center (or the center of gravity) of a land 2 provided on the printed circuit board 1 as the "reference position" used for calculation of the amounts of positional misalignment a and b. A modification may, however, be configured to detect an ideal (designed) printing position of a solder paste 3 or any position selected on the printed circuit board 1 (for example, any one side in an outer circumference of the printed circuit board 1, a mark provided in the printed circuit board 1, or the center of the printed circuit board 1 along the moving direction of the squeegee 27), as the "reference position".

(b) The configuration of the embodiments described above detects the difference (y−x) between the amount of positional misalignment x with regard to the one end-side screen opening 261a and the amount of positional misalignment y with regard to the other end-side screen opening 261b along the moving direction of the squeegee 27, as the "position information of the screen openings 261". The "position information of the screen openings 261" is, however, not limited to such embodiments.

Information based on amounts of positional misalignment with regard to any two screen openings 261 other than these screen openings 261a and 261b in the screen mask 26 (for example, a difference between respective amounts of positional misalignment with regard to any two screen openings 261) may be used as the "position information of the screen openings 261". Information based on an amount of positional misalignment with regard to one screen opening 261 or information based on amounts of positional misalignment with regard to three or more screen openings 261 may also be used as the "position information of the screen openings 261".

Figure 12:
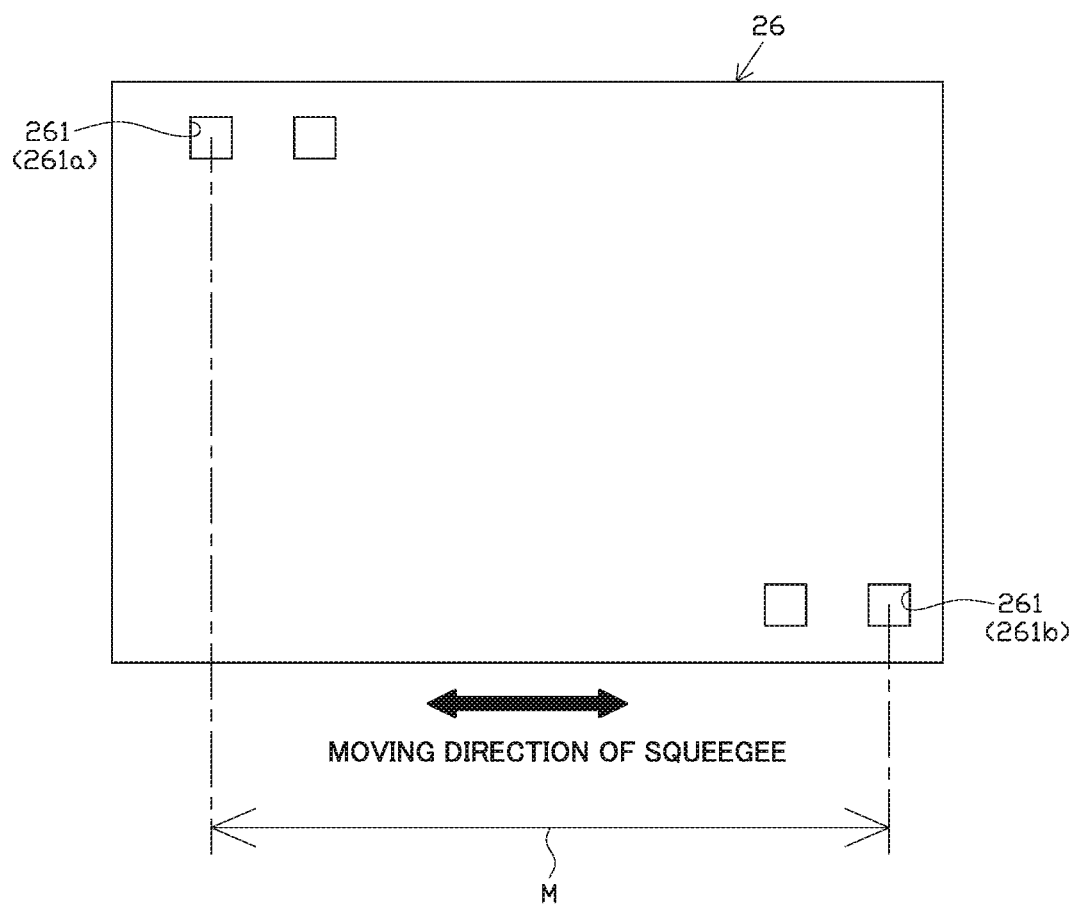
FIG. 12 is a schematic plan view showing a screen mask to illustrate position information of screen openings according to one or more embodiments.
Figure 13:
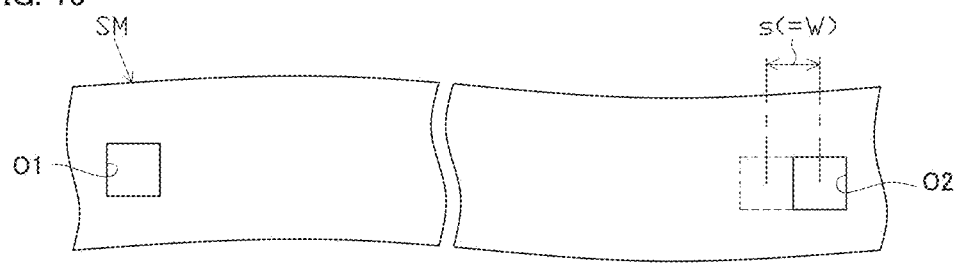
FIG. 13 is a schematic plan view showing a screen mask to illustrate a prior art.
Figure 14:
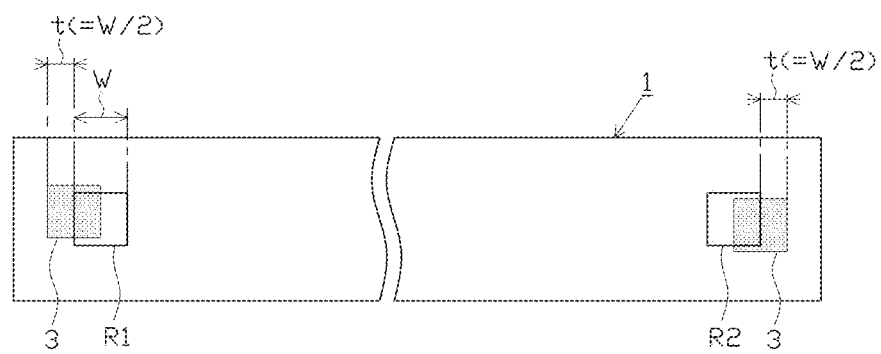
FIG. 14 is a schematic plan view showing a printed circuit board to illustrate the prior art.
Figure 15:
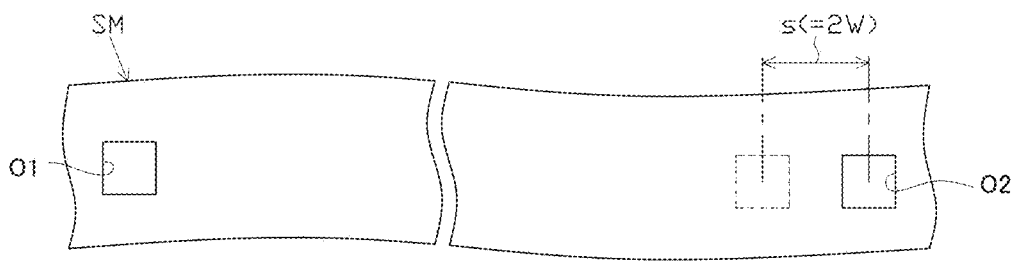
FIG. 15 is a schematic plan view showing a screen mask to illustrate the prior art.
Figure 16:
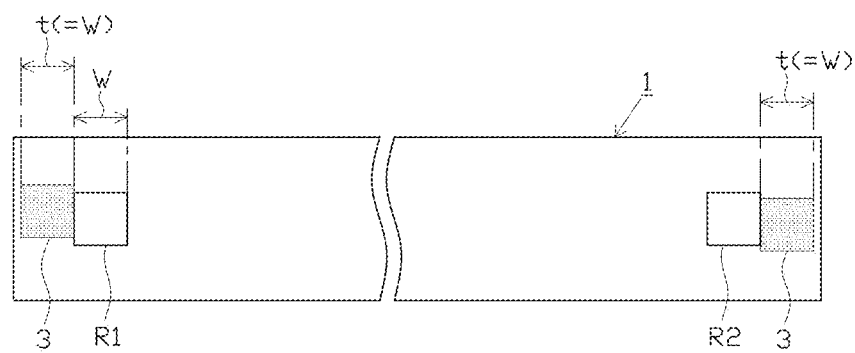
FIG. 16 is a schematic plan view showing a printed circuit board to illustrate the prior art.

Furthermore, a modification may be configured to detect information showing a distance between a plurality of screen openings 261 in the screen mask 26, as the "position information of the screen openings 261". For example, as shown in FIG. 12, a modification may be configured to detect a distance M between the one end-side screen opening 261a and the other end-side screen opening 261b along the moving direction of the squeegee 27 (for example, a distance between respective centers of the screen openings 261a and 261b), as the "position information of the screen openings 261". A distance between a plurality of screen openings 261 different from the screen openings 261a and 261b described above may be detected as the "position information of the screen openings 261".

The configuration of the embodiments described above detects the "position information of the screen openings 261" by using the designed center or (the designed center of gravity) of a screen opening 261 as the "mask reference position". A modification may be configured to detect the "position information of the screen opening 261" by using any position selected in the screen mask 26 (for example, the center of the screen mask 26 or a predetermined mark provided in the screen mask 26) or a predetermined position of the frame 262 provided to hold the screen mask 26 (for example, any one side in an outer circumference of the frame 262) as the "mask reference position".

Additionally, information that indirectly indicates the position of a screen opening 261 may be used as the "position information of the screen openings 261". For example, an interval between any two marks provided in the screen mask 26 may be used as the "position information of the screen openings 261".

In one or more embodiments, information having a component along the moving direction of the squeegee 27 may be used as the "position information of the screen openings 261", like the embodiments described above. This configuration obtains the position information that strongly reflects the effects of the moving squeegee 27 and that more explicitly indicates the degree of deformation of the screen mask 26. This accordingly ensures an inspection with the higher accuracy to determine the good/bad quality of the screen mask 26 itself.

(c) According to the embodiments described above, the individual good/bad quality determiner 56 is configured to determine the good/bad quality of the screen mask 26 itself, based on the respective results of determination by the in-use measure determiner 53 and the in-no-use measure determiner 55. According to a modification, on the other hand, the individual good/bad quality determiner 56 may determine the good/bad quality of the screen mask 26 itself, based on the "position information of the solder pastes 3" obtained by the solder position information detector 52 and the "position information of the screen openings 261" obtained by the opening position information detector 54, without using the results of the determination by the two determiners 53 and 55. For example, a modified configuration may perform good/bad quality determination by comparing the "position information of the solder pastes 3" with the "position information of the screen openings 261".

(d) According to the embodiments described above, when the individual good/bad quality determiner 56 determines that the external factor affecting the screen mask 26 in the printing process is inappropriate, the inspection display device 46 is configured to transmit (display) the information that demands changing the condition relating to printing of the solder pastes 3.

A modified configuration may, on the other hand, be provided with a function of automatically changing the condition relating to printing of the solder pastes 3 when the eternal factor affecting the screen mask 26 in the printing process is determined to be inappropriate. For example, a modified configuration may be provided with a function of automatically regulating the squeegee pressure or the pressing force of the screen mask 26 against the printed circuit board 1 within a fixed appropriate range when the external factor is inappropriate. This modified configuration does not require the operator to regulate the squeegee pressure or the like and accordingly further enhances the production efficiency.

(e) A modification may be configured to transmit the information that demands changing the printing condition affecting the screen mask 26 when the "position information of the solder pastes 3" satisfies a predetermined condition and the in-use measure determiner 53 does not give a determination result of defective (i.e., the screen mask 26 is in such a state that the solder pastes 3 are appropriately printable). This modified configuration enables the printing condition to be changed before the screen mask 26 falls into a state that the solder pastes 3 are not appropriately printable. This modified configuration suppresses defective printed circuit boards 1 from being produced and thereby reduces the production cost. A further modification may be configured to automatically regulate the printing condition when the "position information of the solder pastes 3" satisfies a predetermined condition.

(f) The embodiments described above is configured to fix the moving direction of the squeegee 27 in the process of printing the solder pastes 3 to be identical among the respective printed circuit boards 1. A modification may be configured to appropriately change the moving direction of the squeegee 27 for each printed circuit board 1. For example, a modification may be configured to move the squeegee 27 in the X-axis direction in the process of printing the solder pastes 3 on a certain printed circuit board 1 and to move the squeegee 27 in the Y-axis direction in the process of printing the solder pastes 3 on a next printed circuit board 1. Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . printed circuit board (substrate), 3 . . . solder paste, 26 . . . screen mask, 27 . . . squeegee, 40 . . . solder printing inspection device, 52 . . . solder position information detector (solder position information detection unit), 53 . . . in-use measure determiner (in-use measure determination unit), 54 . . . opening position information detector (opening position information detection unit), 56 . . . individual good/bad quality determiner (individual good/bad quality determination unit), 60 . . . screen mask inspection device, 261 . . . screen opening

What is claimed is:

1. A screen mask inspection device, comprising:
a screen mask including a screen opening that forms a printing pattern;
a printing device that prints a solder paste on a substrate via the screen opening;
a squeegee that is movable in a predetermined direction while contacting an upper surface of the screen mask;
an inspection camera that captures an image of the solder paste printed on the substrate; and
an inspection control device that:
 based on the image captured by the inspection camera, detects, as solder position information, a difference between amounts of positional misalignments of the solder paste printed at two end portions most distant from each other along a moving direction of the squeegee on the substrate; and
 based on the solder position information, identifies whether at least one of a deformation amount and an amount of positional misalignment of the screen mask is within a predetermined allowable range.

2. The screen mask inspection device according to claim 1, wherein
the inspection control device further:
 detects opening position information of the screen opening in a non-printing state; and
 identifies whether at least one of the deformation amount and the amount of positional misalignment of the screen mask is within the predetermined allowable range and identifies whether a pressing force against the substrate by the screen mask or a squeegee force by the squeegee during the printing is within a predetermined allowable range, based on the solder position information and the opening position information.

3. The screen mask inspection device according to claim 2, further comprising:
an inspection display device that transmits, based on a result of identification of whether at least one of the deformation amount and the amount of positional misalignment is within the predetermined allowable range or whether the pressing force or the squeegee force is within the predetermined allowable range, at least one of:
 information prompting a user to replace the screen mask, and
 information prompting the user to change a printing condition affecting the screen mask.

4. A screen mask inspection method for inspecting a screen mask, the method comprising:

providing a screen mask inspection device that comprises:
    the screen mask including a screen opening that forms a printing pattern;
    a printing device that prints a solder paste on a substrate via the screen opening;
    a squeegee that is movable in a predetermined direction while contacting an upper surface of the screen mask; and
    an inspection camera that captures an image of the solder paste printed on the substrate;
providing an inspection control device that:
    based on the image captured by the inspection camera, detects, as solder position information, a difference between amounts of positional misalignments of the solder paste printed at two end portions most distant from each other along a moving direction of the squeegee on the substrate; and
    based on the solder position information, identifies whether at least one of a deformation amount and an amount of positional misalignment of the screen mask is within a predetermined allowable range.

5. The screen mask inspection method according to claim 4, the method further comprising:
    detecting opening position information of the screen opening in a non-printing state; and
    identifying whether at least one of the deformation amount and the amount of positional misalignment of the screen mask is within the predetermined allowable range and identifying whether a pressing force against the substrate by the screen mask or a squeegee force by the squeegee during the printing is within a predetermined allowable range, based on the solder position information and the opening position information.

* * * * *